(12) United States Patent
Tsai et al.

(10) Patent No.: US 11,956,887 B2
(45) Date of Patent: Apr. 9, 2024

(54) BOARD, CIRCUIT BOARD, AND FIXTURE

(71) Applicant: Skiileux Electricity Inc., Taoyuan (TW)

(72) Inventors: Shang-Wei Tsai, Taoyuan (TW); Cheng Chieh Chang, Taoyuan (TW); Te Fu Chang, Taoyuan (TW)

(73) Assignee: Skiileux Electricity Inc., Taoyuan (TW)

( * ) Notice: Subject to any disclaimer, the term of this patent is extended or adjusted under 35 U.S.C. 154(b) by 270 days.

(21) Appl. No.: 17/585,576

(22) Filed: Jan. 27, 2022

(65) Prior Publication Data

US 2022/0377876 A1 Nov. 24, 2022

(30) Foreign Application Priority Data

May 21, 2021 (TW) .................... 110118377

(51) Int. Cl.
*H05K 1/02* (2006.01)
*H05B 3/26* (2006.01)
*H05K 3/26* (2006.01)

(52) U.S. Cl.
CPC ............. *H05K 1/0212* (2013.01); *H05B 3/26* (2013.01); *H05B 2203/002* (2013.01); *H05B 2203/016* (2013.01); *H05K 2201/10106* (2013.01)

(58) Field of Classification Search
CPC ........ H05K 1/02; H05K 1/0212; H05K 1/162; H05K 1/165; H05K 3/26; H05K 2201/10106; H05K 2203/002; H05K 2203/016; H01L 23/3135; H01L 23/3128; H01L 24/81; H01L 25/50; H01L 25/0657;
(Continued)

(56) References Cited

U.S. PATENT DOCUMENTS 5,644,342 A * 7/1997 Argyres ................. B41J 2/3551
347/57
5,951,893 A * 9/1999 Bitko ..................... H01L 25/50
257/E21.705
(Continued)

FOREIGN PATENT DOCUMENTS

TW 202119886 5/2021

OTHER PUBLICATIONS

"Office Action of Taiwan Counterpart Application", dated Mar. 24, 2022, p. 1-p. 3.

*Primary Examiner* — Xiaoliang Chen
(74) *Attorney, Agent, or Firm* — JCIPRNET

(57) ABSTRACT

A board, including a first pad area, a second pad area, a first micro heater, a second micro heater, a first heater terminal pad, a second heater terminal pad, and a third heater terminal pad, is provided. The first pad area and the second pad area respectively include at least one pad. The first micro heater and the second micro heater are respectively disposed corresponding to the first pad area and the second pad area. The first heater terminal pad and the second heater terminal pad form a loop with the first micro heater by being electrically connected to an outside, so that the first micro heater generates heat. The second heater terminal pad and the third heater terminal pad form another loop with the second micro heater by being electrically connected to the outside, so that the second micro heater generates heat. A circuit board and a fixture are also provided.

13 Claims, 8 Drawing Sheets

(58) Field of Classification Search
CPC .... B41J 2/3551; B41J 2/0458; B41J 2/04541;
B41J 2/04543
USPC ............... 361/783; 147/260; 347/12, 57
See application file for complete search history.

(56) References Cited

U.S. PATENT DOCUMENTS

| | | | |
|---|---|---|---|
| 2002/0179329 A1* | 12/2002 | Fukuoka | H05K 1/162 174/250 |
| 2008/0088332 A1 | 4/2008 | Beaman et al. | |
| 2011/0073586 A1* | 3/2011 | Lim | F25D 21/08 29/611 |
| 2012/0085163 A1* | 4/2012 | Yamaguchi | G01F 1/00 73/204.25 |
| 2015/0062252 A1* | 3/2015 | Fujii | B41J 2/14072 347/58 |
| 2017/0018533 A1* | 1/2017 | Miki | H01L 25/50 |
| 2020/0046025 A1* | 2/2020 | Otiaba | G01R 27/02 |

* cited by examiner

BOARD, CIRCUIT BOARD, AND FIXTURE

CROSS-REFERENCE TO RELATED APPLICATION

This application claims the priority benefit of Taiwan application serial no. 110118377 filed on May 21, 2021. The entirety of the above-mentioned patent application is hereby incorporated by reference herein and made a part of this specification.

BACKGROUND

Technical Field

The disclosure relates to a board, a circuit board, and a fixture, and more particularly relates to a board, a circuit board, and a fixture suited for heating installation.

Description of Related Art

If electronic components are to be connected to the pads of a board, a micro heater is often used to solder the electronic components to the pads of the board. With the trend of electronic devices becoming lighter, thinner, shorter, and smaller, the current issue is finding a way to reduce the number of the micro heater terminal pads on the board while achieving effective soldering.

SUMMARY

The disclosure provides a board, a circuit board, and a fixture, which are beneficial to miniaturizing an electronic device and are relatively simple to use or have better performance and/or applicability.

The board of the disclosure includes a first pad area, a second pad area, a first micro heater, a second micro heater, a first heater terminal pad, a second heater terminal pad, and a third heater terminal pad. The first pad area and the second pad area respectively include at least one pad. The first micro heater and the second micro heater are respectively disposed opposite to the first pad area and the second pad area. The first heater terminal pad and the second heater terminal pad form a loop with the first micro heater by being electrically connected to an outside, so that the first micro heater generates heat, and the second heater terminal pad and the third heater terminal pad form another loop with the second micro heater by being electrically connected to the outside, so that the second micro heater generates heat.

The circuit board of the disclosure includes the board and a circuit layer. The circuit layer is electrically connected to the first pad area and the second pad area of the board.

The fixture of the disclosure includes a heating probe set, which includes at least two probe heads, and the at least two probe heads are configured to contact one of the first heater terminal pad and the second heater terminal pad of the board and the second heater terminal pad and the third heater terminal pad of the board.

The fixture of the disclosure includes a heating probe set, which includes at least two probe heads, and the at least two probe heads are configured to contact one of the first heater terminal pad and the second heater terminal pad of the circuit board and the second heater terminal pad and the third heater terminal pad of the circuit board.

Based on the above, the board, the circuit board, and the fixture of the disclosure may reduce the number and area of the heater terminal pads on the board and the circuit board through sharing the heater terminal pads between two adjacent pad areas, and may also reduce the number of probe heads of the fixture, which are beneficial to miniaturizing the electronic device and lowering the cost, and are relatively simple to use or have better performance and/or applicability.

In order to make the aforementioned features and advantages of the disclosure comprehensible, embodiments accompanied with drawings are described in detail below.

DETAILED DESCRIPTION OF DISCLOSED EMBODIMENTS

Figure 1A:
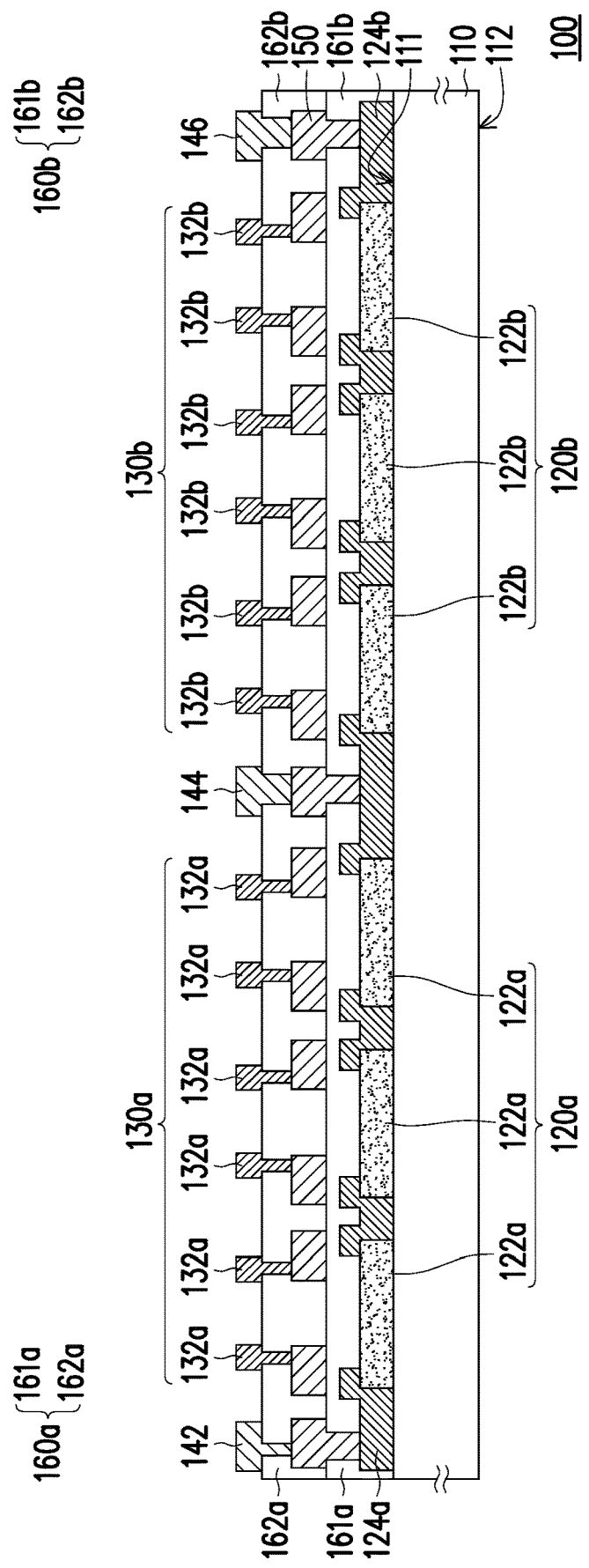
FIG. 1A is a partial cross-sectional schematic view of a board according to an embodiment of the disclosure.

The content of the following embodiments is for illustration rather than limitation. Moreover, the description of conventional devices, methods, and materials may be omitted so as not to obscure the description of the various principles of the disclosure. Directional terms (for example, up and down) used herein are only used with reference to the drawings or corresponding conventional terminologies and are not intended to imply absolute orientation. In the drawings, for the sake of clarity, the size of some components or film layers may be enlarged or reduced. Similar members are denoted by the same reference numerals and have similar functions, materials, or forming manners, and the description is omitted. It will be obvious to persons skilled in the art to which the disclosure pertains that based on the content of the embodiments and the corresponding illustrations of the drawings, the disclosure may be practiced in other embodiments that deviate from the specific details disclosed herein.

Figure 1B:
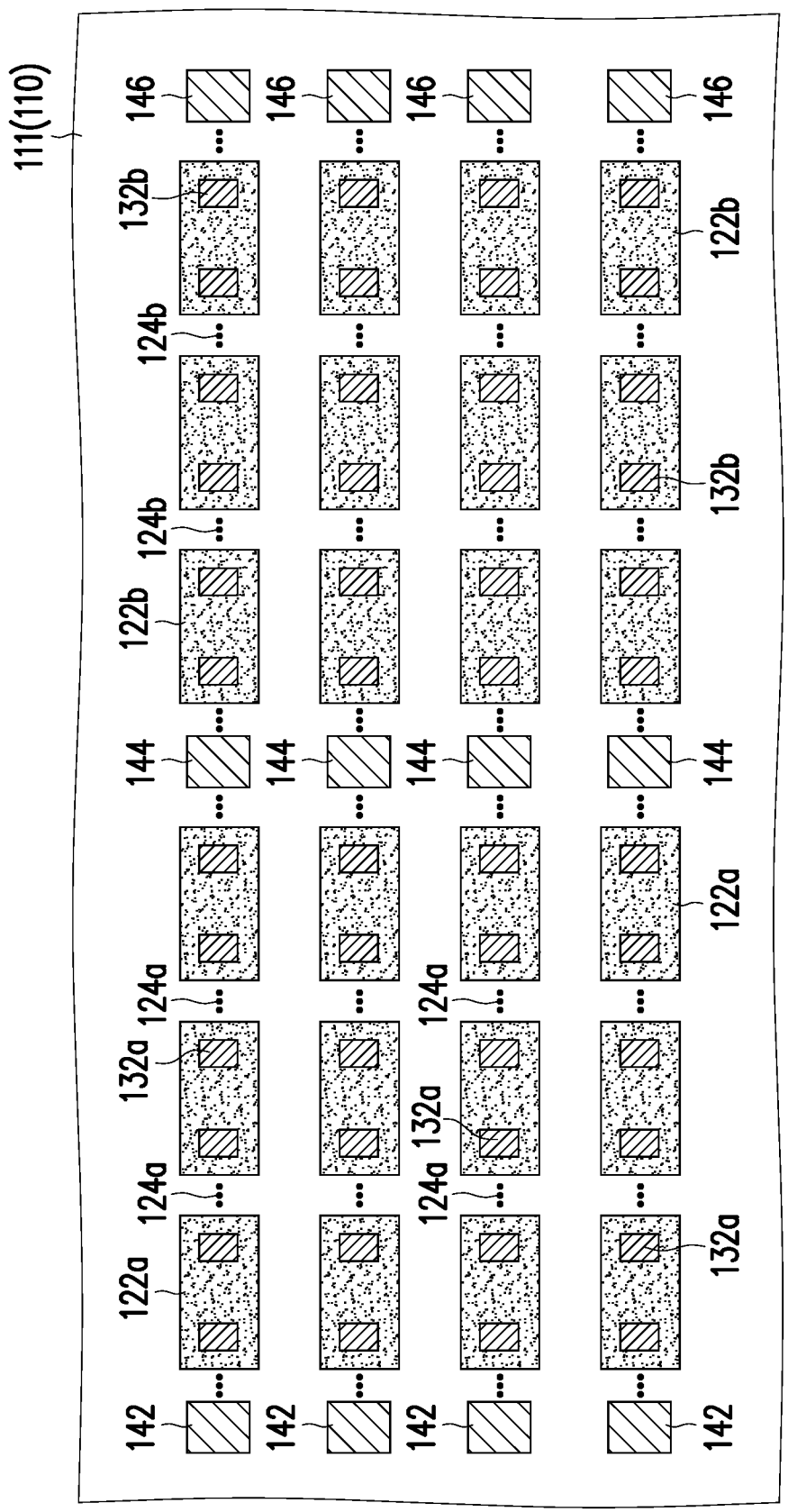
FIG. 1B is a partial top schematic view of a board according to an embodiment of the disclosure.

FIG. 1A is a partial cross-sectional schematic view of a board according to an embodiment of the disclosure. FIG. 1B is a partial top schematic view of a board according to an embodiment of the disclosure. For the sake of clarity, FIG. 1A is shown in perspective view, and some members are omitted.

Referring to FIGS. 1A and 1B, a board 100 includes a first pad area 130a, a second pad area 130b, a first micro heater 120a, a second micro heater 120b, a first heater terminal pad 142, a second heater terminal pad 144, and a third heater terminal pad 146. A substrate 110 has a first surface 111 and a second surface 112 opposite to the first surface 111. The first micro heater 120a, the second micro heater 120b, the first heater terminal pad 142, the second heater terminal pad 144, and the third heater terminal pad 146 may be configured on the first surface 111 of the substrate 110. The substrate 110 may include a rigid board (such as, but not limited to, a glass board and a glass fiber board (such as an FR4 board)) and/or a soft board (such as, but not limited to, a polyimide film (PI) or other suitable soft substrates), but the disclosure is not limited thereto. The first surface 111 of the substrate 110 may include the first pad area 130a and the second pad area 130b, but the disclosure is not limited thereto, and the number of pad areas may be adjusted according to the requirements. The first pad area 130a and the second pad area 130b respectively include at least one pad 132a, 132b. For example, the first pad area 130a includes at least one pad 132a, and the second pad area 130b includes at least one pad 132b. The material of the pads 132a and 132b includes, for example, a metal (such as, but not limited to, copper or other alloys) with a high melting point (such as a higher melting point than the material of a connecting member 172 of an electronic component 170 described later), but the disclosure is not limited thereto.

In this embodiment, the first micro heater 120a is disposed opposite to the first pad area 130a, and the second micro heater 120b is disposed opposite to the second pad area 130b. For example, the first micro heater 120a may be disposed between the pad 132a and the substrate 110, and the second micro heater 120b may be disposed between the pad 132b and the substrate 110.

In this embodiment, the first heater terminal pad 142 and the second heater terminal pad 144 may be electrically connected by an external power source. Then, a loop is formed with the first micro heater 120a, so that the first micro heater 120a generates heat. The second heater terminal pad 144 and the third heater terminal pad 146 may be electrically connected by an external power source. Then, a loop is formed with the second micro heater 120b, so that the second micro heater 120b generates heat. In other words, in the board 100, the first micro heater 120a may be on a conductive path 124a between the first heater terminal pad 142 and the second heater terminal pad 144, and the second micro heater 120b may be on a conductive path 124b between the second heater terminal pad 144 and the third heater terminal pad 146.

In this embodiment, the number of the first micro heater 120a or the second micro heater 120b may be at least one. For example, the first micro heater 120a may include at least one micro heating component 122a, or the second micro heater 120b may include at least one micro heating component 122b. The number and/or configuration of the micro heating components 122a and 122b and/or the pads 132a and 132b may be adjusted according to the design requirements, which is not limited in the disclosure. For example, the micro heating components 122a and 122b are arranged as an array on the first surface 111 of the substrate 110, and one micro heating component (such as the micro heating component 122a/122b) may be disposed opposite to two pads (such as the pad 132a/132b).

In this embodiment, at least one micro heating component may be electrically connected via a conductive path. For example, multiple micro heating components 122a may be connected in series or in parallel on the conductive path 124a, or multiple micro heating components 122b may be connected in series or in parallel on the conductive path 124b.

In an embodiment, an insulating structure 160a may be disposed between the first pad area 130a and the first micro heater 120a, and an insulating structure 160b may be disposed between the second pad area 130b and the second micro heater 120b. That is, the first pad area 130a and the first micro heater 120a are not in direct contact, and the second pad area 130b and the second micro heater 120b are not in direct contact. The insulating structures 160a, 160b may respectively include first insulating layers 161a and 161b and second insulating layers 162a and 162b successively stacked on the first micro heater 120a and the second micro heater 120b, but the disclosure is not limited thereto.

In an embodiment, the board 100 may further include a circuit layer 150. The layout design of the circuit layer 150 may be adjusted according to the requirements, which is not limited in the disclosure.

The circuit layer 150 is located between the pads 132a and 132b and the first micro heater 120a and the second micro heater 120b. The circuit layer 150 is located on the first insulating layers 161a and 161b and covered by the second insulating layers 162a and 162b. The circuit layer 150 is electrically connected to the pads 132a and 132b through conductive vias of the second insulating layers 162a and 162b. In an embodiment, the board 100 containing the circuit layer 150 may also be referred to as a circuit board.

In an embodiment, the first heater terminal pad 142 and the second heater terminal pad 144 may be electrically connected to the first micro heater 120a through the corresponding conductive vias, the corresponding circuit in the circuit layer 150, and the conductive path 124a. The second heater terminal pad 144 and the third heater terminal pad 146 may be electrically connected to the second micro heater 120b through the corresponding conductive vias, the corresponding circuit in the circuit layer 150, and the conductive path 124b, but the disclosure is not limited thereto.

In an embodiment, the first heater terminal pad 142, the second heater terminal pad 144, the third heater terminal pad 146, and the pads 132a and 132b may be the same film layer. Therefore, the board 100 may be relatively simple to use or manufacture.

In an embodiment, the resistance values of the micro heating components 122a and 122b may range from 10 ohms ($\Omega$) to 500$\Omega$. In other words, the micro heating components 122a and 122b may be resistive heaters.

Figure 2:
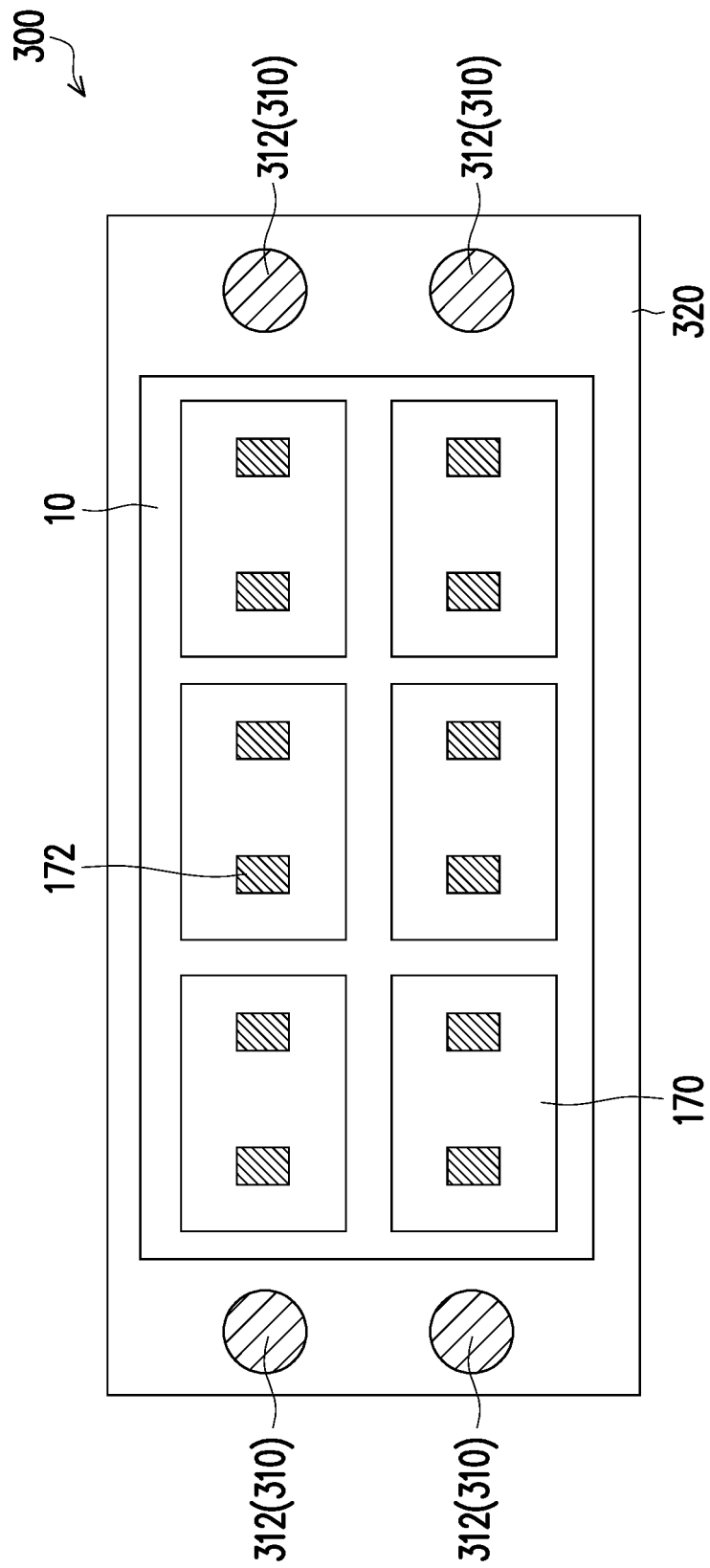
FIGS. 2 to 4 show a manufacturing process of a circuit board according to an embodiment of the disclosure.
Figure 3:
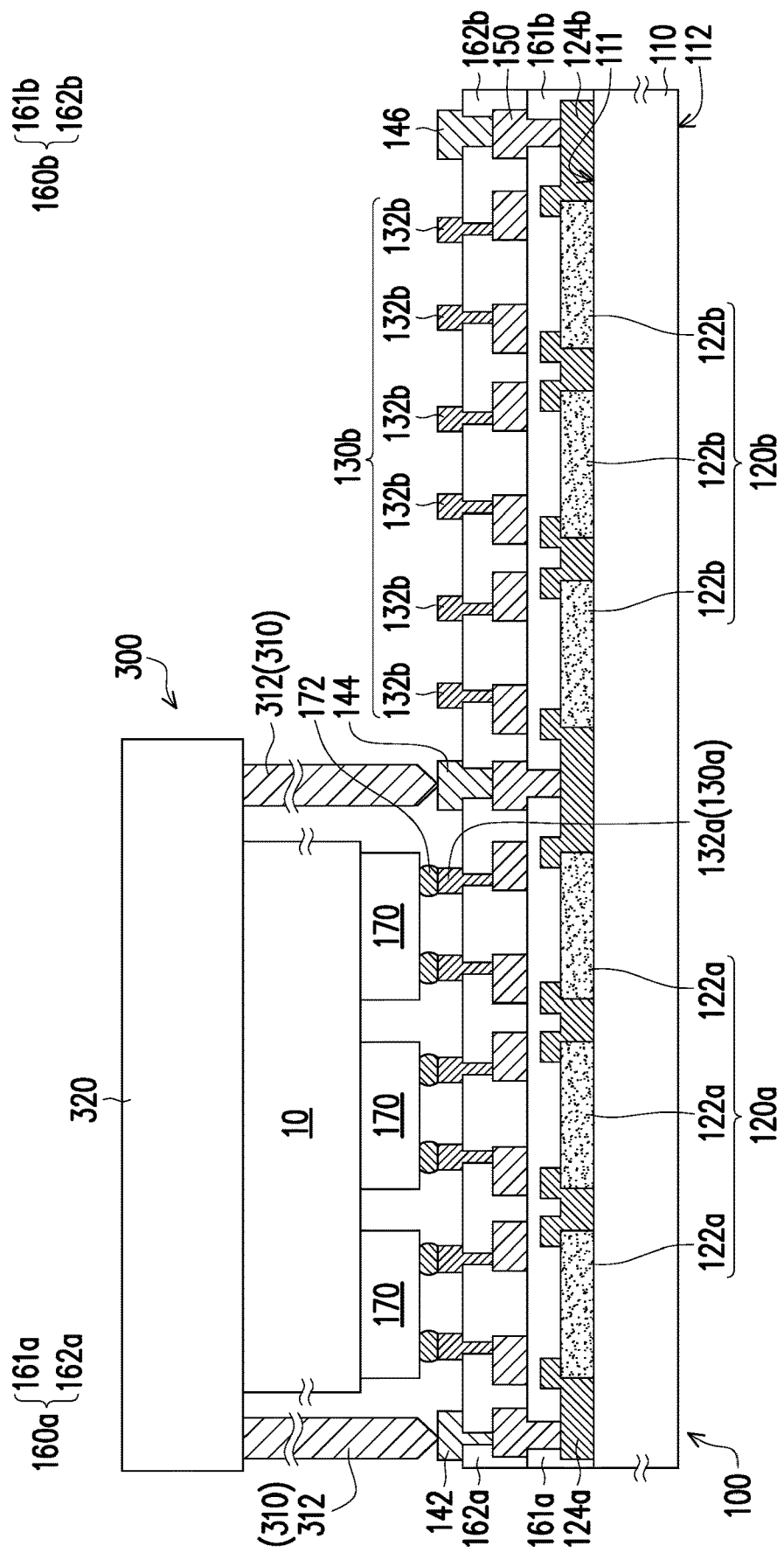
Figure 4:
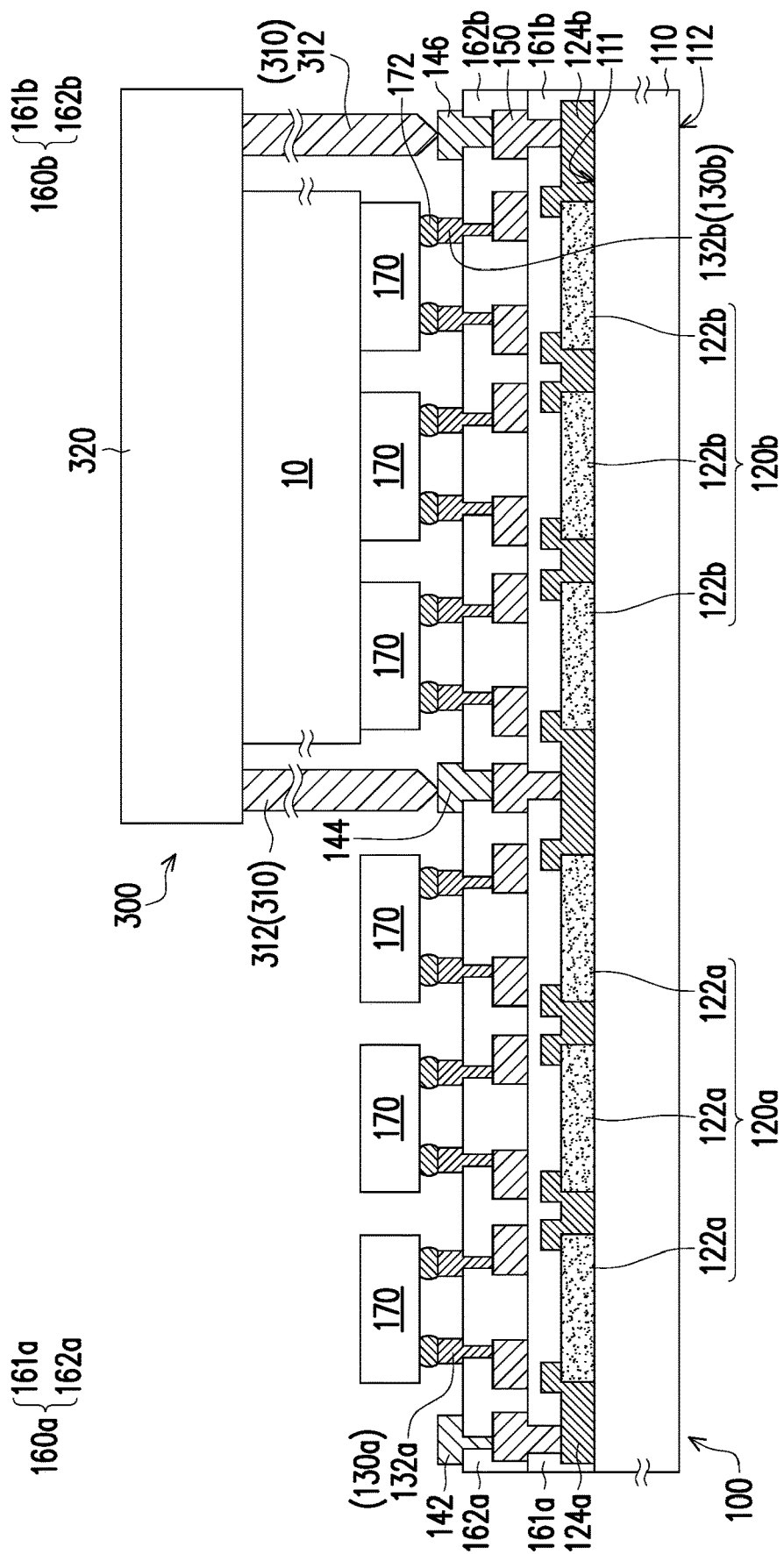

FIGS. 2 to 4 are schematic views of a manufacturing process of a circuit board according to an embodiment of the disclosure. FIG. 2 is a top schematic view of a fixture according to an embodiment of the disclosure. FIGS. 3 to 4 are cross-sectional schematic views of a manufacturing process of a circuit board according to an embodiment of the disclosure. The boards in FIGS. 3 and 4 are similar to the board 100 of the foregoing embodiment, and similar members thereof are denoted by the same or similar reference numerals and have similar functions, materials, or uses, so the description is omitted.

Referring to FIG. 2, a fixture 300 is provided, and the electronic component 170 is carried on the fixture 300. The fixture 300 includes a heating probe set 310. The heating probe set 310 includes at least two probe heads 312, which may be configured to contact the first heater terminal pad 142 and the second heater terminal pad 144 of the board 100 or configured to contact the second heater terminal pad 144 and the third heater terminal pad 146 of the board 100.

It should be noted that the disclosure does not limit the number of probe heads 312 in the heating probe set 310, and the number of probe heads 312 may be set according to actual requirements.

In an embodiment, the fixture 300 may further include a carrier member 320, which is suitable for configuring at least one electronic component 170 on the first pad area 130a or the second pad area 130b of the board 100. For example, the carrier member 320 may indirectly carry the electronic component 170 through a carrier body 10, so that the electronic component 170 is configured on the first pad area 130a or the second pad area 130b of the board 100, but the disclosure is not limited thereto. The carrier body 10 may include glass, plastic, or blue film, but the disclosure is not limited thereto.

In an embodiment, the carrier member 320 may directly carry the electronic component 170.

The electronic component 170 may include at least one connecting member 172 for connecting with the board 100. The material of the connecting member 172 includes, for example, a conductor (such as, but not limited to, a solder) with a low melting point (i.e., the melting point is lower than the melting points of the pads 132*a* and 132*b*, the micro heaters 120*a* and 120*b*, and the insulating structures 160*a* and 160*b* of the board 100). The shape of the connecting member 172 is not limited in the disclosure.

In an embodiment, the electronic component 170 may be, for example, a light emitting diode, but the disclosure is not limited thereto.

It should be noted that the number of electronic components 170 carried by the carrier member 320 may be set according to actual requirements, and the disclosure is not limited thereto.

Referring to FIG. 3, the board 100 containing the circuit layer 150 is provided, and the electronic component 170 is configured on the first pad area 130*a* of the board 100 through the fixture 300. In this embodiment, the board containing the circuit layer adopted is the board 100 (also referred to as the circuit board 100) containing the circuit layer 150 of the foregoing embodiment. Therefore, the same or similar reference numerals or terms are adopted in the subsequent drawings or description, so repeated content is not described. In an embodiment not shown, a board containing a circuit layer used may be a board similar to the board 100.

For example, the probe head 312 of the fixture 300 is respectively opposite to and in contact with the first heater terminal pad 142 and the second heater terminal pad 144 of the board 100, and the connecting member 172 of the electronic component 170 is opposite to and in contact with the pad 132*a* of the first pad area 130*a*. Since the probe head 312 is in contact with the first heater terminal pad 142 and the second heater terminal pad 144, the first micro heater 120*a* is electrically connected to the outside to form a loop, so that the first micro heater 120*a* may be electrically heated. The heat generated by the first micro heater 120*a* may be transferred to the pad 132*a* and the connecting member 172 of the electronic component 170 thermally coupled thereon. That is, the pad 132*a* and the connecting member 172 located thereon may be heated by the first micro heater 120*a*. After moderate and/or timely heating, the connecting member 172 thermally coupled to the pad 132*a* may, for example, be melted. Then, the heating may be stopped to cool and solidify the connecting member 172, so that there is a good electrical connection between the electronic component 170 and the corresponding pad 132*a*. Then, the fixture 300 may be removed to achieve the purpose of installing the electronic component 170 on the board 100.

Referring to FIG. 4, the electronic component 170 may continue to be carried on the fixture 300, and the electronic component 170 is configured on the second pad area 130*b* of the board 100 through the fixture 300. The electronic component 170 is configured on the second pad area 130*b* of the board 100 in a manner similar to FIG. 3. For example, the electronic component 170 is carried on the carrier member 320 of the fixture 300, and the probe head 312 of the fixture 300 is respectively opposite to and in contact with the second heater terminal pad 144 and the third heater terminal pad 146 of the board 100, so that the connecting member 172 of the electronic component 170 is opposite to and in contact with the pad 132*b* of the second pad area 130*b*. Since the probe head 312 is in contact with the second heater terminal pad 144 and the third heater terminal pad 146, the second micro heater 120*b* may be electrically connected to the outside to form a loop, so that the second micro heater 120*b* may be electrically heated. The heat generated by the second micro heater 120*b* may be transferred to the pad 132*b* and the connecting member 172 of the electronic component 170 thermally coupled thereon. That is, the pad 132*b* and the connecting member 172 located thereon may be heated by the second micro heater 120*b*. After moderate and/or timely heating, the connecting member 172 thermally coupled to the pad 132*b* may, for example, be melted. Then, the heating may be stopped to cool and solidify the connecting member 172, so that there is a good electrical connection between the electronic component 170 and the corresponding pad 132*b*. Then, the fixture 300 may be removed to achieve the purpose of installing the electronic component 170 on the board 100.

The steps similar to FIGS. 3 to 4 are repeated until all the electronic components 170 to be bonded are bonded on the board 100 to complete the manufacturing of a circuit board 200. It should be noted that, in this embodiment, only the steps of bonding a part of the electronic components and a portion of the board are shown as an illustration, and there is still a portion of the board 100 that is not bonded to the electronic components at other places not shown.

Since the electronic component 170 is bonded to the board 100 in sections through the fixture 300, and the two adjacent pad areas (such as the first pad area 130*a* and the second pad area 130*b*) share a portion of the heater terminal pad (such as the second heater terminal pad 144), the number and area of the heater terminal pads of the board 100 or the circuit board 200 may be reduced, and the number of probe heads 312 of the fixture 300 may also be reduced, which are beneficial to miniaturizing the electronic device and lowering the cost, and are relatively simple to use or have better performance and/or applicability.

Figure 5:
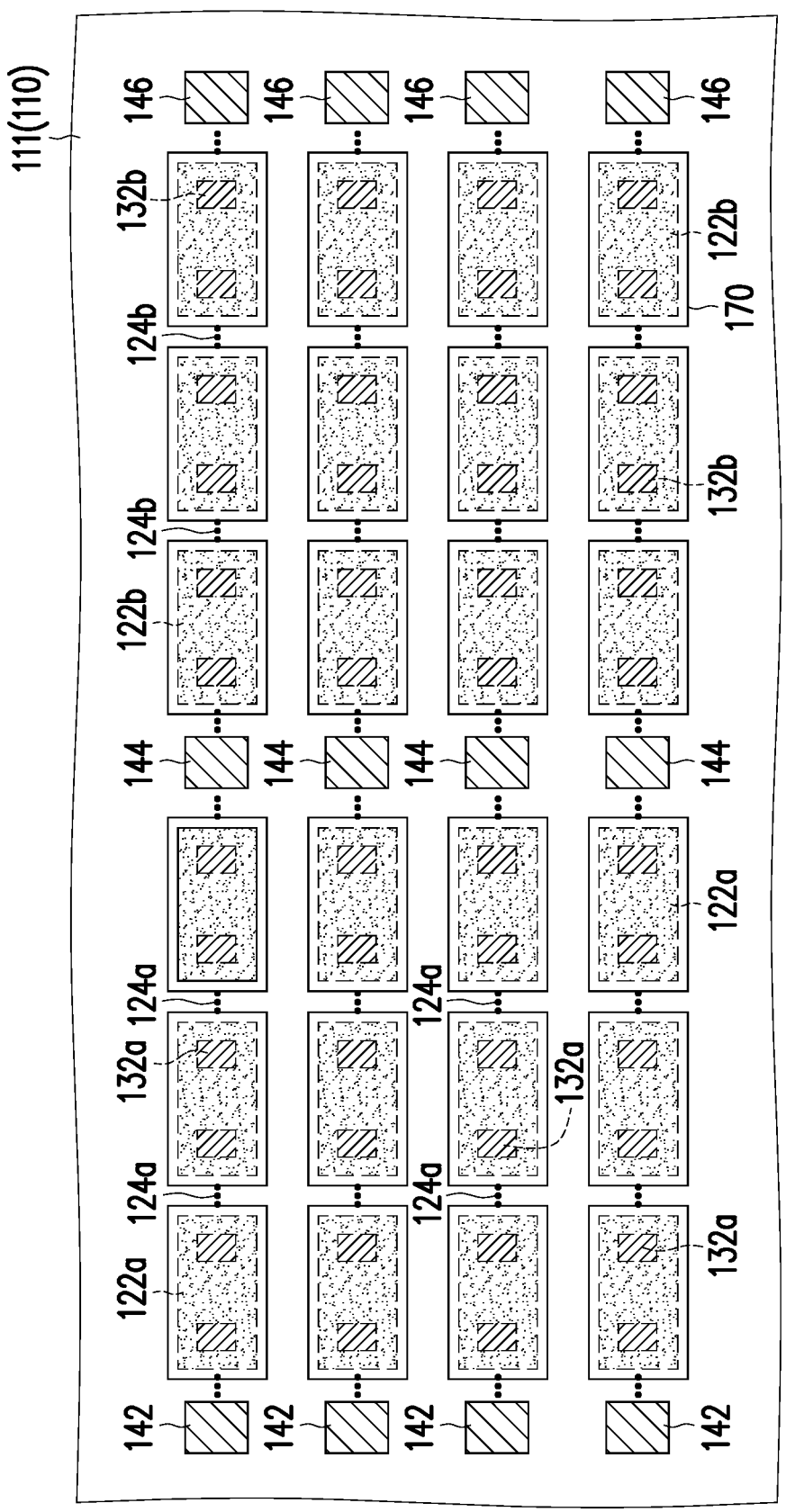
FIG. 5 is a partial top schematic view of a circuit board according to an embodiment of the disclosure.

FIG. 5 is a partial top schematic view of a circuit board according to an embodiment of the disclosure.

Referring to FIG. 5, the circuit board 200 includes the board 100 and the circuit layer 150. The board 100 is similar to the board 100 of the foregoing embodiment and includes the first pad area 130*a*, the second pad area 130*b*, the first micro heater 120*a*, the second micro heater 120*b*, the first heater terminal pad 142, the second heater terminal pad 144, and the third heater terminal pad 146. The first pad area 130*a* includes at least one pad 132*a*, and the second pad area 130*b* includes at least one pad 132*b*. The first micro heater 120*a* is disposed opposite to the first pad area 130*a*, and the second micro heater 120*b* is disposed opposite to the second pad area 130*b*. The first micro heater 120*a* is composed of at least one micro heating component 122*a*, and the second micro heater 120*b* is composed of at least one micro heating component 122*b*. Multiple micro heating components 122*a* may be connected in series or in parallel and are electrically connected to each other through the conductive path 124*a*, and multiple micro heating components 122*b* may be connected in series or in parallel and are electrically connected to each other through the conductive path 124*b*. The first heater terminal pad 142 and the second heater terminal pad 144 may be electrically connected to the first micro heater 120*a*, and the second heater terminal pad 144 and the third heater terminal pad 146 may be electrically connected to the second micro heater 120*b*.

The circuit layer 150 is electrically connected to the first pad area 130*a* and the second pad area 130*b*. Specifically, the circuit layer 150 is located between the pads 132*a* and 132*b* and the first micro heater 120*a* and the second micro heater 120*b*, and is electrically connected to the pads 132*a* and 132*b*, but the disclosure is not limited thereto.

In an embodiment, the circuit board 200 may further include the electronic component 170. The electronic component 170 may be disposed corresponding to the micro heating components 122*a* and 122*b*. The electronic component 170 may be, for example, a light emitting diode, but the disclosure is not limited thereto. The electronic component 170 may include at least one connecting member 172, and the connecting member 172 may correspond to the pads 132*a* and 132*b* of the board 100. The electronic components 170 may be arranged as an array on the board 100, but the disclosure is not limited thereto.

In an exemplary application of the circuit board 200, the circuit board 200 may be a backlight board or a portion of the backlight board.

In an exemplary application of the circuit board 200, the circuit board 200 may be a display board or a portion of the display board.

Figure 6:
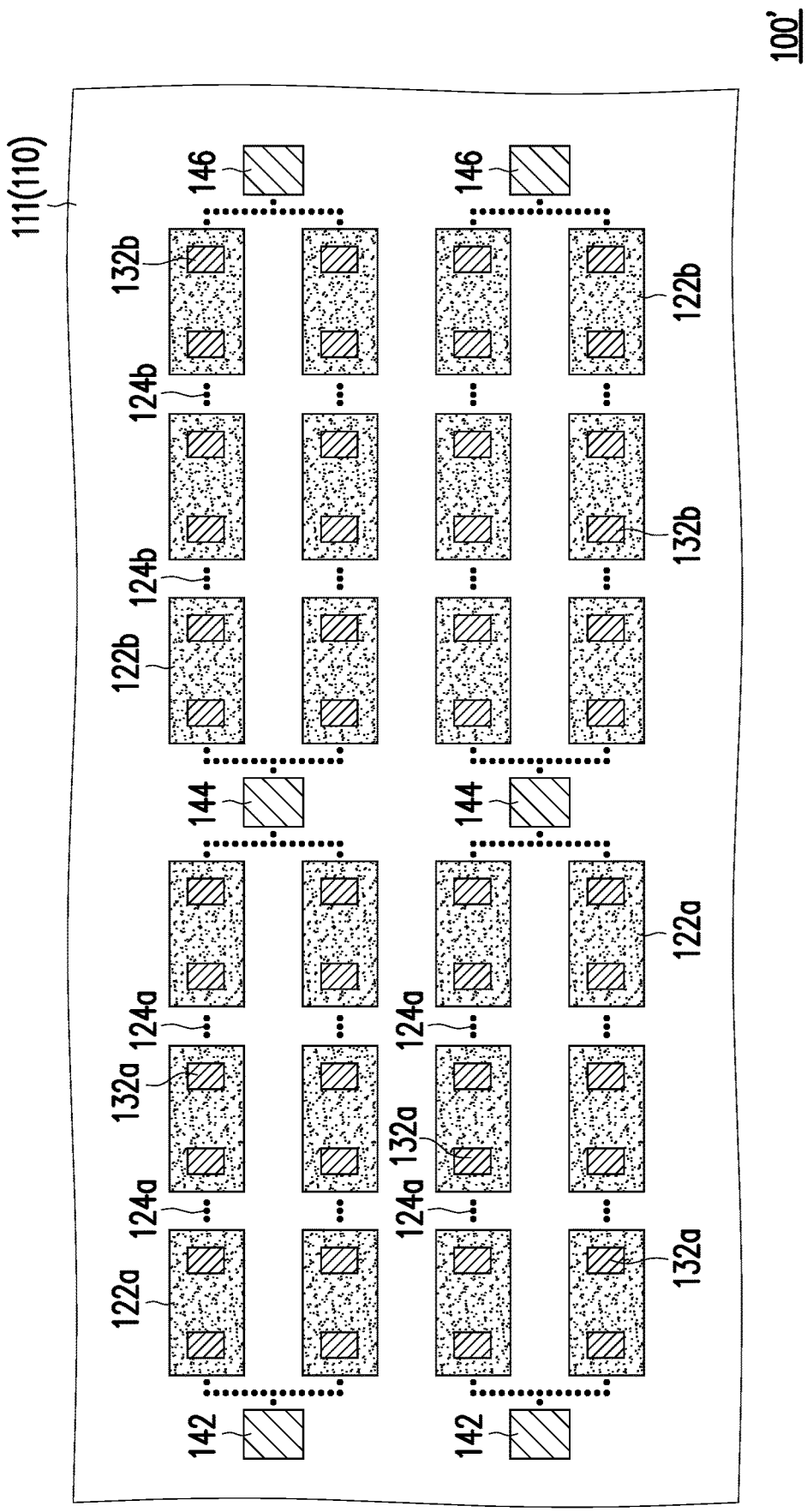
FIG. 6 is a partial top schematic view of a board according to an embodiment of the disclosure.

FIG. 6 is a partial top schematic view of a board according to an embodiment of the disclosure. The board of FIG. 6 is similar to the board 100 of the foregoing embodiment, and similar members thereof are denoted by the same or similar reference numerals and have similar functions, materials, or uses, so the description is omitted.

Referring to FIG. 6, the biggest difference between a board 100' of this embodiment and the embodiment of FIG. 1 is that two adjacent conductive paths 124*a* may be connected in parallel to connect to the same first heater terminal pad 142 and the same second heater terminal pad 144; and the adjacent conductive paths 124*b* may be connected in parallel to connect to the same second heater terminal pad 144 and the same third heater terminal pad 146. In other words, the micro heating components 122*a* on two adjacent conductive paths 124*a* may be electrically connected to the outside through the same first heater terminal pad 142 and the same second heater terminal pad 144, and the micro heating components 122*b* on two adjacent conductive paths 124*b* may be electrically connected to the outside through the same second heater terminal pad 144 and the same third heater terminal pad 146, thereby reducing the number and area of the heater terminal pads of the board 100'.

In some embodiments, the board 100' may also use a method similar to FIGS. 2 to 4 such that the electronic component 170 is disposed on the board 100' to form a circuit board, but the disclosure is not limited thereto.

Figure 7:
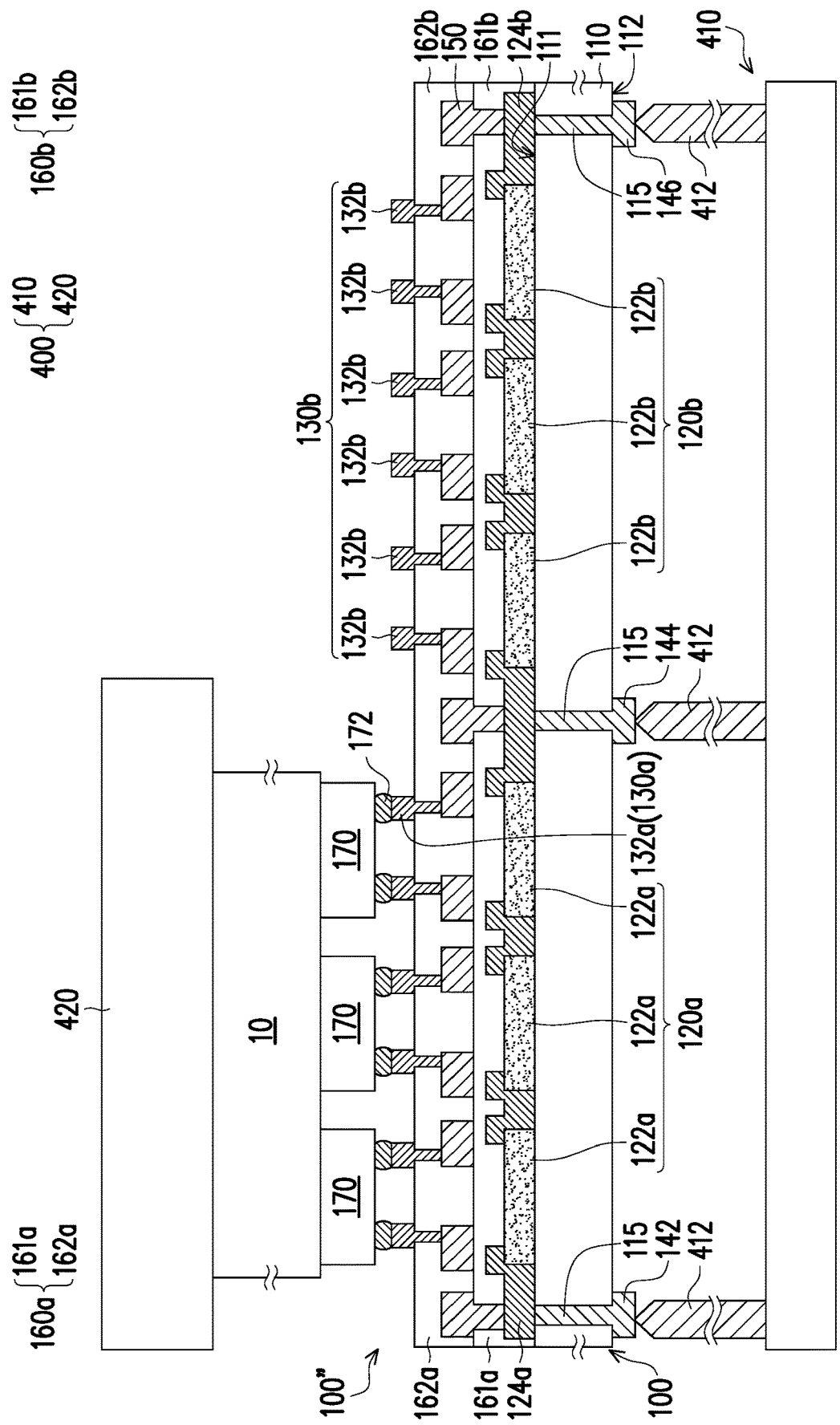
FIG. 7 is a manufacturing process of a circuit board according to an embodiment of the disclosure.

FIG. 7 is a cross-sectional schematic view of a manufacturing process of a circuit board according to an embodiment of the disclosure. The board in FIG. 7 is similar to the circuit board 100 of the foregoing embodiment, the fixture in FIG. 7 is similar to the fixture 300 of the foregoing embodiment, and similar members thereof are denoted by the same or similar reference numerals and have similar functions, materials, or uses, so the description is omitted.

Referring to FIG. 7, a board 100" is provided. One difference between the board 100" of this embodiment and the foregoing embodiment is that the first heater terminal pad 142, the second heater terminal pad 144, and the third heater terminal pad 146 of the board 100" are located on the second surface 112 of the board 100", and the substrate 110 further includes a conductive structure 115 penetrating the substrate 110. The conductive structure 115 corresponds to the first heater terminal pad 142, the second heater terminal pad 144, and the third heater terminal pad 146, and is electrically connected to the conductive paths 124*a* and 124*b*, the first heater terminal pad 142, the second heater terminal pad 144, and the third heater terminal pad 146.

Referring to FIG. 7 again, a fixture 400 is provided. The fixture 400 includes a heating probe set 410 and a carrier member 420. The heating probe set 410 includes a probe head 412, which is configured to contact the first heater terminal pad 142, the second heater terminal pad 144, and/or the third heater terminal pad 146 of the board 100". The carrier member 420 is suitable for configuring at least one electronic component 170 on the first pad area 130*a* or the second pad area 130*b* of the board 100".

Referring to FIG. 7 again, the electronic component 170 is configured on the first pad area 130*a* of the board 100" through the fixture 400. For example, the carrier member 420 of the fixture 400 may directly or indirectly carry the electronic component 170, and the connecting member 172 of the electronic component 170 is opposite to and in contact with the pad 132*a* of the first pad area 130*a*. The heating probe set 410 of the fixture 400 may be temporarily fixed under the board 100", and the probe head 412 is opposite to and in contact with the first heater terminal pad 142, the second heater terminal pad 144, and the third heater terminal pad 146. The heating probe set 410 may power on at least two probe heads 412 corresponding to the first pad area 130*a*, for example, the heating probe set 410 may power on two probe heads 412 corresponding to the first heater terminal pad 142 and the second heater terminal pad 144. Since the probe head 412 is in contact with the first heater terminal pad 142 and the second heater terminal pad 144, the first micro heater 120*a* is electrically connected to the outside to form a loop, so that the first micro heater 120*a* may be electrically heated. The heat generated by the first micro heater 120*a* may be transferred to the pad 132*a* and the connecting member 172 of the electronic component 170 thermally coupled thereon. That is, the pad 132*a* and the connecting member 172 located thereon may be heated by the first micro heater 120*a*. After moderate and/or timely heating, the connecting member 172 thermally coupled to the pad 132*a* may, for example, be melted. Then, the heating may be stopped to cool and solidify the connecting member 172, so that there is a good electrical connection between the electronic component 170 and the corresponding pad 132*a*. Then, the carrier member 420 may be removed to achieve the purpose of installing the electronic component 170 on the board 100".

Similarly, the electronic component 170 may continue to be carried on the carrier member 420, and the electronic component 170 is configured on the second pad area 130*b* of the board 100" or other areas not shown through the fixture 400 until all the electronic components 170 to be bonded are all bonded on the board 100" to complete the manufacturing similar to the circuit board 200.

Since the heating probe set 410 of the fixture 400 may be fixed under the board 100", it is possible to thermally couple the electronic component 170 to the board 100" by only moving the carrier member 420 to a preset area (for example, the second pad area 130*b*), and powering on the corresponding at least two probe heads 412 (for example, the probe heads 412 opposite to the second heater terminal pad 144 and the third heater terminal pad 146).

In an embodiment, the board 100" may also include the conductive paths 124*a* and 124*b* connected in parallel with each other similar to the embodiment of FIG. 6, but the disclosure is not limited thereto.

In summary, the board, the circuit board, and the fixture of the disclosure may reduce the number and area of the heater terminal pads on the board and the circuit board through sharing the heater terminal pads between two adjacent pad areas, and may also reduce the number of probe heads of the fixture, which are beneficial to miniaturizing the electronic device and lowering the cost, and are relatively simple to use or have better performance and/or applicability.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A board, comprising:
    a first pad area and a second pad area, wherein the first pad area and the second pad area respectively comprise at least one pad;
    a first micro heater and a second micro heater, respectively disposed opposite to the first pad area and the second pad area; and
    a first heater terminal pad, a second heater terminal pad, and a third heater terminal pad, wherein the first heater terminal pad and the second heater terminal pad form a loop with the first micro heater by being electrically connected to an outside, so that the first micro heater generates heat, and the second heater terminal pad and the third heater terminal pad form another loop with the second micro heater by being electrically connected to the outside, so that the second micro heater generates heat.

2. The board according to claim 1, wherein the first micro heater and the second micro heater respectively comprise at least one micro heating component, wherein the at least one micro heating component is electrically connected by a conductive path.

3. The board according to claim 2, wherein the conductive path electrically connects the at least one micro heating component in series or in parallel.

4. The board according to claim 1, wherein an insulating structure is respectively disposed between the first pad area and the first micro heater, and between the second pad area and the second micro heater.

5. A circuit board, comprising:
    the board according to claim 1; and
    a circuit layer, electrically connected to the first pad area and the second pad area of the board.

6. The circuit board according to claim 5, further comprising at least one electronic component, electronically connected to the first pad area and the second pad area of the board.

7. The circuit board according to claim 6, wherein the at least one electronic component is a light emitting diode.

8. The circuit board according to claim 6, wherein the circuit board is a backlight board or a display board.

9. The circuit board according to claim 5, wherein the first micro heater and the second micro heater respectively comprise at least one micro heating component, wherein the at least one micro heating component is electrically connected by a conductive path.

10. The circuit board according to claim 9, wherein the conductive path electrically connects the at least one micro heating component in series or in parallel.

11. The circuit board according to claim 5, wherein an insulating structure is respectively disposed between the first pad area and the first micro heater, and between the second pad area and the second micro heater.

12. A fixture, comprising:
    a heating probe set, comprising at least two probe heads, wherein the at least two probe heads are configured to contact one of:
    a first heater terminal pad and a second heater terminal pad of a board; and
    the second heater terminal pad and a third heater terminal pad of the board, wherein the board comprising:
    a first pad area and a second pad area, wherein the first pad area and the second pad area respectively comprise at least one pad;
    a first micro heater and a second micro heater, respectively disposed opposite to the first pad area and the second pad area; and
    the first heater terminal pad, the second heater terminal pad, and the third heater terminal pad, wherein the first heater terminal pad and the second heater terminal pad form a loop with the first micro heater by being electrically connected to an outside, so that the first micro heater generates heat, and the second heater terminal pad and the third heater terminal pad form another loop with the second micro heater by being electrically connected to the outside, so that the second micro heater generates heat.

13. The fixture according to claim 12, further comprising:
    a circuit layer, electrically connected to the first pad area and the second pad area of the board.

* * * * *